United States Patent
Zangara

[19]

[11] Patent Number: 5,917,224

[45] Date of Patent: Jun. 29, 1999

[54] COMPACT ROM MATRIX

[75] Inventor: Louis Zangara, Seyssins, France

[73] Assignee: Dolphin Integration, Maylan, France

[21] Appl. No.: 08/867,237

[22] Filed: Jun. 2, 1997

[30] Foreign Application Priority Data

May 31, 1996 [FR] France ................................. 96 06949

[51] Int. Cl.⁶ .............................. H01L 29/76; H01L 29/94
[52] U.S. Cl. ......................... 257/390; 257/208; 257/211; 438/130
[58] Field of Search ....................................... 257/390, 209, 257/208, 211; 365/104; 438/130

[56] References Cited

U.S. PATENT DOCUMENTS

| 5,241,205 | 8/1993 | Shimizu et al. ......................... 257/368 |
| 5,381,030 | 1/1995 | Kasai ....................................... 257/390 |
| 5,442,212 | 8/1995 | Eimori ..................................... 257/303 |
| 5,600,171 | 2/1997 | Makihara et al. ...................... 257/390 |

OTHER PUBLICATIONS

Patent Abstracts of Japan, vol. No. 391 (E–0968), Aug. 23, 1990 & JP 02 144965 A (Hitachi Ltd), Jun. 4, 1990.
Copy of French Preliminary Search Report, Feb. 24, 1997.

*Primary Examiner*—Jerome Jackson, Jr.
*Assistant Examiner*—George C. Eckert, II
*Attorney, Agent, or Firm*—Arthur L. Plevy

[57] ABSTRACT

A matrix memory array includes a P-type semiconductor substrate, thick oxide columns separating active columns, gate rows, a gate insulator interposed at the locations where these rows cover the active columns, N-type islands limited by the thick oxide columns and the gate rows, first conductive columns at the pitch of the active columns, constituting bit lines, second conductive columns at a pitch which is twice that of the first columns, constituting reference lines, and connections between each island and a first or second conductive column.

14 Claims, 4 Drawing Sheets

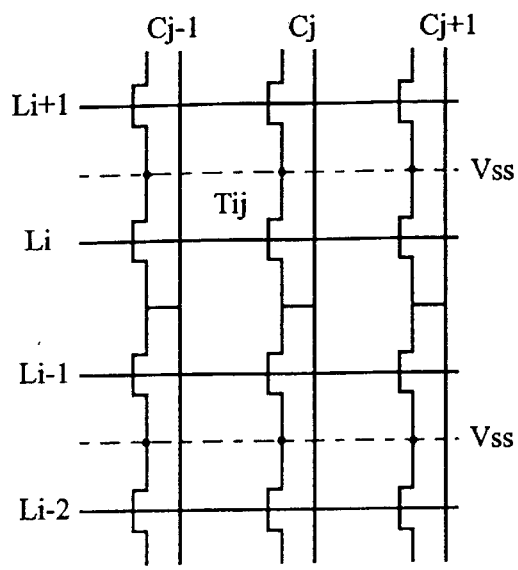
Fig 3 (PRIOR ART)
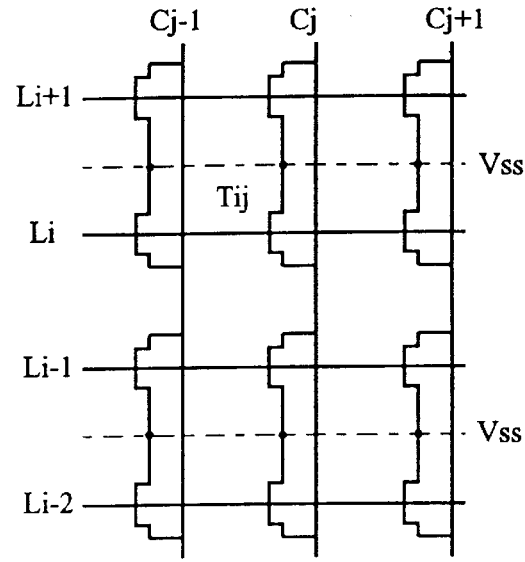
Fig 4 (PRIOR ART)
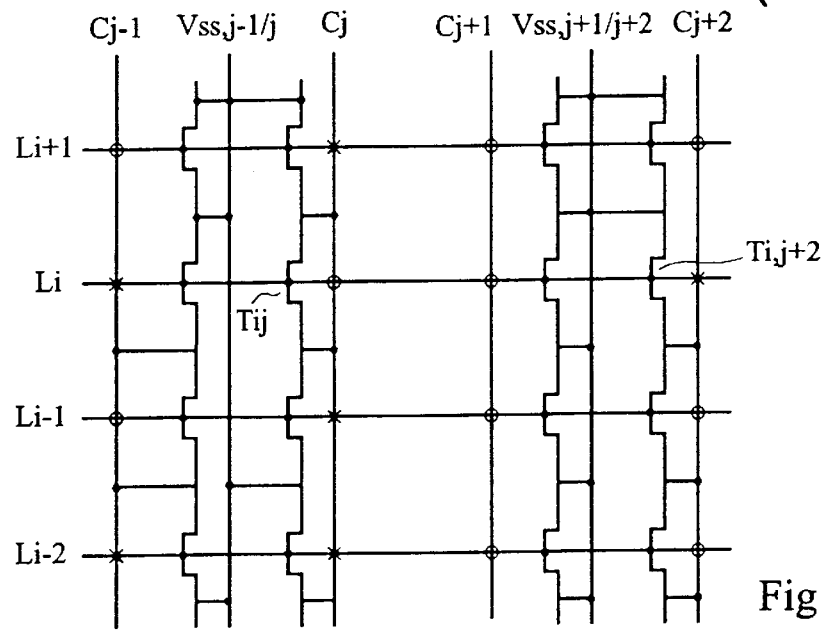
Fig 5
|     | j-1 | j | j+1 | j+2 |
|-----|-----|---|-----|-----|
| i+1 | 0   | 1 | 0   | 0   |
| i   | 1   | 0 | 0   | 1   |
| i-1 | 0   | 1 | 0   | 0   |
| i-2 | 1   | 1 | 0   | 0   |
Fig 6

COMPACT ROM MATRIX

BACKGROUND OF THE INVENTION

1. Field of the Invention

The present invention relates to a ROM memory matrix or memory array.

2. Discussion of the Related Art

FIG. 1 generally shows the structure of a ROM matrix. This matrix comprises a set of rows or word lines Li crossing columns or bit lines Cj. At each crossing of a row Li and a column Cj, a transistor Tij is placed, having its gate connected to a line Li, its drain to a column Cj and its source to a reference potential Vss, for example, the ground.

The memory matrix is programmed upon fabrication, so that there exists or not a transistor Tij at each crossing point. For reasons of simplicity of fabrication and charge balancing, a transistor Tij is generally placed at each crossing point and the transistors located at the crossing points which are desired to be inactive are inhibited, for example, by inhibiting their gate, or by not implementing their drain connection.

This matrix structure is associated with several circuits for decoding rows or word lines and columns or bit lines, precharge, amplification, multiplexing, etc. These various circuits, which are known and are not per se the object of the present invention, will not be described herein.

FIG. 2 very schematically shows a cross-sectional view along a column of a basic structure implementing the memory array of FIG. 1. Each transistor Tij is formed in a lightly-doped semiconductor substrate 10 of a first conductivity type, and is separated from its neighbors by a thick oxide region 11. Gate G of this MOS transistor corresponds to a portion of a conductive line Li, for example, in polysilicon, covering all the gates of the MOS transistors in a same row and extending, between the transistors, above the thick oxide regions. The sources S of all the transistors in a same row correspond to a portion of a continuous diffused row connected to potential Vss (there is no thick oxide between the sources of adjacent transistors in a same row). All the drains D of the transistors of a column are connected to a same column metallization Cj through vias 12.

The diagram of FIG. 2 is extremely simplified and, in practical implementations, various modifications are made. For example, the drains and sources are of LDD-type, a threshold adjustment doping is performed under the gates, the gate polysilicon is coated with a metal silicide, several levels of polysilicon exist, several levels of metallization exist . . .

Anyway, the successive steps of fabrication of an integrated circuit incorporating a ROM array sequentially include the following main steps:

forming a pre-array, forming a thick oxide, forming a first level of polysilicon, forming diffused areas, forming several levels of metallization.

Generally, in the semiconductor industry, the technical operations implemented in the silicon (Front End) are clearly separated from the operations relative to forming metallizations and vias (Back End). These two types of operations are performed in different sections of a same array, or even in different arrays.

From a practical point of view, it is interesting to postpone the steps of programming a memory array (determining the active and inactive transistors) to the Back End steps. Thus, an intermediary component including all the diffusions in the silicon, at the level of the memory array as well as at the level of the other components, for example, a processor, implemented in the same integrated circuit, can be prefabricated and stored to program the ROM array by the metallizations upon arrival of a customer order, which enables to achieve much faster supply times.

As previously indicated, there are several techniques for inhibiting selected crossing points.

A first family of techniques consists of inhibiting the transistor gates. This can be done by leaving a thick oxide at the location where the thin gate oxide would have been formed. This technique has the disadvantage that the programming of the memory array has to be done at the first fabrication step. Another technique consists of implementing arrays under the gate to highly dope the substrate and thus make the gate action inoperative. This other technique has the disadvantage of being complex and adding a fabrication step with respect to usual processes, and also of being implemented in the Front End steps.

However, these gate programming techniques have the advantage of enabling to considerably increase the integration density with respect to the basic structure illustrated in FIG. 1.

This is illustrated in FIG. 3 which shows a memory array implemented so that each pair of word lines shares a same reference row Vss (in the example, between rows Li-2 and Li-1 and between rows Li and Li+1). This means that each pair of adjacent transistors of a same row shares a same source. Similarly, the drains of two adjacent transistors, for example between lines Li-1 and Li, are common. The advantage of this structure is that the rows of thick oxide are suppressed between transistor rows and the number of drains and sources is divided by 2. Clearly, as a result, there is a very significant size reduction of the memory array with respect to the basic diagram of FIG. 1.

A second important family of techniques consists of implementing or not the connections between a column metallization and individual drains. For this purpose, as shown in FIG. 2, it should be noted that it is enough to suppress some of vias 12. The programming can thus be performed by a contact etching mask (which may be implemented between two upper metallization layers and not under a lower metallization layer as shown in the drawing). This type of technique has the advantage that the programming of the ROM can be performed at the Back End steps.

However, these techniques have the disadvantage that it is no longer possible, as in the diagram of FIG. 3, to provide a structure in which adjacent transistors have a common drain. It is then necessary to use memory array configurations of the type shown in FIG. 4 where adjacent transistors do have a common source but have separated drains, that is, there will be a FIG. 4. Thus, with respect to the basic structure of FIG. 1, the size is reduced by suppressing one source diffusion out of two and the intermediary thick oxide between these sources, but all drain diffusions and the thick oxides separating these drain regions are maintained.

Thus, in the current state of the art, one practically has to choose between privileging either the compactness of a memory array by selecting a gate programming technique, at the cost of fabrication convenience, or fabrication convenience by selecting a drain programming technique at the cost of compactness.

SUMMARY OF THE INVENTION

Thus, an object of the present invention is to provide a ROM array programmable by metallizations and having a high compactness.

Another object of the present invention is to provide such a memory array which is particularly simple to implement and to program.

Another object of the present invention is to provide such a memory array with low stray capacitances and which can thus be read quickly.

To achieve these objects, the present invention provides a matrix memory array with substantially orthogonal rows and columns including a semiconductor substrate of a first conductivity type, thick oxide columns separating active columns, gate rows in a first conductive material, a gate insulator being interposed at the locations where these rows cover the active columns, doped islands of the second type of conductivity limited by the thick oxide columns and the gate rows, first conductive columns at the pitch of the active columns, constituting bit lines, second conductive columns at a pitch which is twice that of the first columns, constituting reference lines, and electric connection means between each island and the first corresponding conductive column or the second adjacent conductive column.

According to an embodiment of the invention, an active transistor, comprised of two islands located on either side of a gate area, is implemented by connecting the first island to a first column and the second island to a second column.

According to an embodiment of the invention, an inactive transistor, comprised of two islands located on either side of a gate area, is implemented by connecting its two islands to a first column or to a second column.

According to an embodiment of the invention, each of the islands is connected to pads located at a given metallization level.

According to an embodiment of the invention, the programing is performed by selecting the configuration of the metallization level including the pads and also the reference and via lines connecting some of the pads to a higher metallization level.

According to an embodiment of the invention, for a given programming, the connections of the islands of each active column are selected so that the number of connections to the bit line is lower than the number of connections to the reference line.

The foregoing objects, features and advantages of the present invention will be discussed in detail in the following non-limiting description of specific embodiments of the present invention, in relation with the accompanying drawings.

BRIEF DESCRIPTION OF THE DRAWINGS

FIGS. 3 and 4, previously described, schematically show memory arrays;

FIG. 5 shows a memory array according to the invention;

FIG. 6 shows a programming table of the memory array of FIG. 5;

DETAILED DESCRIPTION

As usual in the field of the representation of semiconductor components, the various structural views are not shown to scale.

Figure 1:
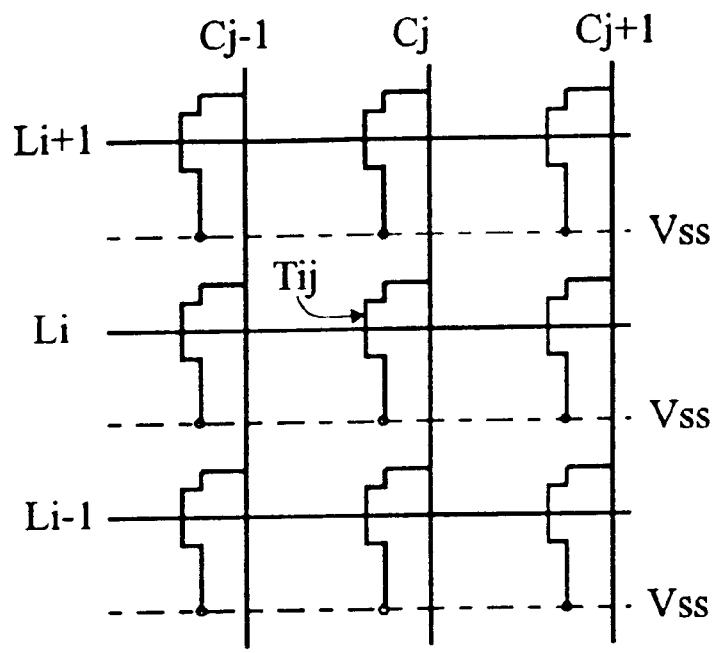
FIG. 1, previously described, basic diagram of a ROM array.
Figure 2:
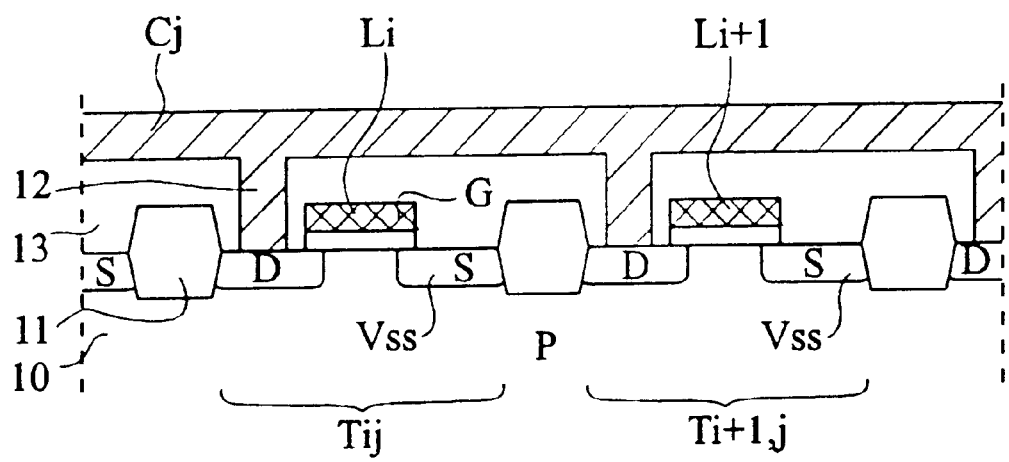
FIG. 2, previously described, shows a cross-sectional view along a column of a portion of a simplified structure implementing a memory array.

As shown in FIG. 5, a memory array according to the present invention includes columns of transistors in which the sources and drains of two adjacent transistors are confounded, that is, for two adjacent crossing points in a same column, only two diffused regions are used, which gives the structure, in the column direction, the same compactness as in the case of the embodiment of FIG. 3. These diffused regions appear as islands. Conversely to the case of the structures of FIGS. 1, 3 and 4 (in which the connections to reference potential Vss are implemented by diffused rows, portions of which correspond to transistor sources), there is no continuity between sets of diffused regions in a same row.

As previously, all gates in a same row of crossing points, for example, row Li, are comprised of portions of a same conductive line, for example, a polysilicon line.

In the column direction, to each column of diffused islands is associated a column metallization (Cj−1, Cj, Cj+1, Cj+2) forming a bit line and to each pair of bit lines is associated a column metallization or reference line. Thus, there is a reference line $Vss_{j-1/j}$ between bit lines Cj−1 and Cj and a reference line $Vss_{j+1/j+2}$ between bit lines Cj+1 and Cj+2.

To make a transistor Tij active, one of its terminals (drain or source) is connected to the corresponding column Cj and its other terminal (source or drain) is connected to the corresponding column $Vss_{j-1/j}$. To make the transistor inactive, its two terminals are connected either to column Cj or to column $Vss_{j-1/j}$.

By examining FIG. 5, it should be noted that the portion of memory array shown corresponds to the programming table shown in FIG. 6. For example, transistor Tij, the two terminals of which are connected to column Cj, is inactive and transistor Ti,j+2, a terminal of which is connected to its bit line and the other one to its reference line, is active.

Thus, the memory array according to the invention, illustrated in FIG. 5, has the same compactness in the column direction as the memory array of FIG. 3 and thus a significantly higher compactness than the memory array of FIG. 4.

In the row direction, the memory array according to the invention is apparently less compact than the memory array of FIGS. 3 and 4, due to the presence of reference lines. However, the difference is actually negligible. Indeed, if, say, eight successive columns are considered, the present invention provides to add to the eight bit lines four metallized columns constituting reference lines. But, in practice, even in a structure of the type of that in FIG. 3, the conductivity of the diffused rows for connection to potential Vss is low. In order to increase it, metallic contacts have to be periodically taken back on these diffused rows to establish connections with metallic columns which are provided, for example, once every eight columns. Thus, according to the present invention, only three metallic columns are in fact added per group of eight bit lines with respect to the structure of FIG. 3. Further, the provision of these reference columns does not lead to a significant increase in size in the row direction with respect to the case where they are absent. Indeed, in the row direction, at least the drains of two adjacent transistors are separated by a thick oxide region and this thick oxide region has substantially the width required for positioning a metallic line. The size increase thus is null or very low.

Using a conventional process for which the pattern definition limit is 0.5 $\mu$m, a structure according to the present invention has a size increase of only a few percents, for example, 5 to 8%, with respect to a structure of the type of FIG. 3. Conversely, the structure of FIG. 4 would result in a surface increase of around 25% with respect to that in FIG. 3.

Thus, the present invention, while substantially maintaining the compactness advantages of the structure of FIG. 3, further exhibits the advantage of being programmable during the Back End steps like the structure of FIG. 4.

Another advantage of the present invention with respect to prior structures results from the existence of an insulated reference line per pair of bit lines, this reference line being different for each pair of bit lines. Conversely, in prior art structures, as it has been indicated previously, all reference lines at potential Vss are interconnected. The mutual insulation of the reference lines obtained with the structure according to the present invention leads to the possibility of simultaneously addressing only a chosen number of reference lines. Thus, when only a limited number of bit lines is addressed, only the corresponding reference lines will be addressed. As a result, stray capacitances and memory consumption are reduced.

Another advantage of the present invention results from the fact that no diffused island is specifically assigned to a connection to terminal Vss. Thus, for an inactive transistor, the two corresponding adjacent islands are connected either to Vss (reference line) or to Vdd (bit line). The choice of the connections for a given crossing point depends on the choice made for the previous crossing point in the same column. However, this choice can be reversed for all the transistors in a column. Accordingly, it is possible for each active column to optimize the connections in order to majoritarily connect the pairs of terminals of the inactive transistors to Vss.

Thus, the charge on bit line Cj, connected to a high potential Vdd in the read phase, can be reduced, whereby the reading rate is increased. For example, in the example of FIG. 5, it should be noted that for the crossing points of line j, there are more connections to bit line Cj than to reference line $Vss_{j-1/j}$; should it be a complete matrix, the connections could be reversed without any drawbacks (the same occurs for line j+2).

Figure 7A:
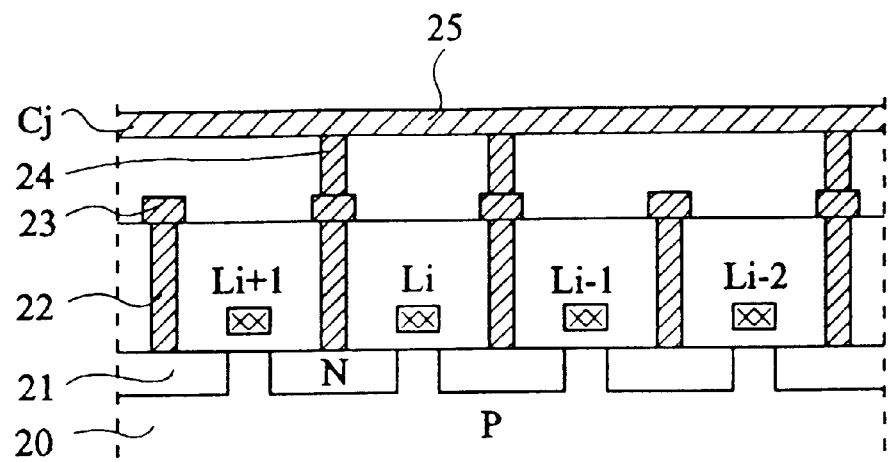
FIG. 7A shows a cross-sectional view along a column of a portion of a structure implementing a memory array according to the invention.
Figure 7B:
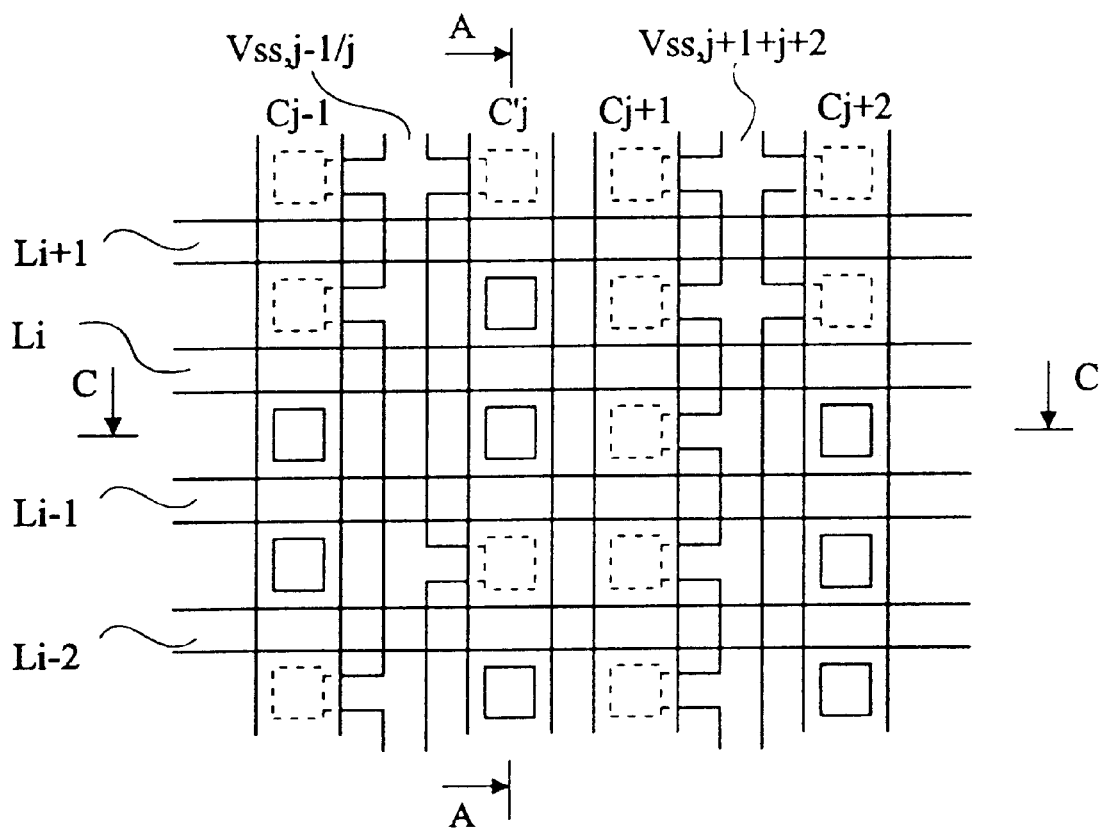
FIG. 7B shows an elevational view of a portion of a memory array according to the invention.
Figure 7C:
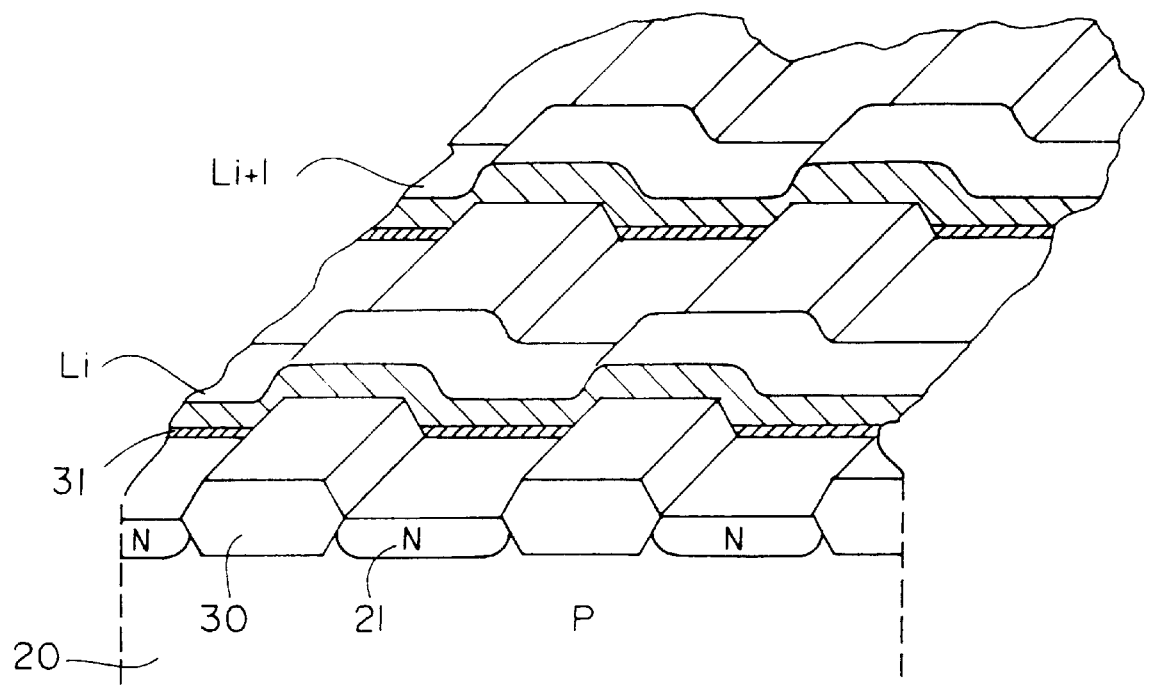
FIG. 7C shows a cross-sectional view along a row, and in perspective view, of a portion of a memory array according to the invention prior to the making of the metallizations.

FIGS. 7A, 7B and 7C illustrate an embodiment of the invention. It will be clear for those skilled in the art that the described embodiment is used as an example only and that many alternative embodiments are possible, especially as concerns the materials used and the metallization levels.

FIG. 7A shows a cross-sectional view of a portion of an embodiment of a memory array according to the invention along an active column. In a semiconductor substrate 20 of a first conductivity type, for example P, are formed doped islands 21 of the opposite type of conductivity, here type N. The islands 21 are separated by substrate regions covered with a gate insulator and with a portion of a polysilicon row, Li+1, Li, Li−1, Li−2. Each island 21 is connected by a via 22 to a pad 23 of a first metallization level. The pads 23 are connected either by a via 24 to a higher metallization level 25 corresponding to a column Cj or, outside the drawing, to a metallization of the same level constituting a reference column, for example, $Vss_{j-1/j}$. Thus, the selected programming is given to the structure at the level of the etching of pads 23 and vias 24.

Of course, implementing various alternative connections of an island to a bit line or a reference line is within the abilities of those skilled in the art. In technologies using several levels of metallization, for example, 4 to 7, the programming can be obtained by choosing configurations of metallizations and vias of higher level.

FIG. 7B shows an elevational view of the structure where lines Cj−1, $Vss_{j-1/j}$, Cj, Cj+1, $Vss_{j+1/j+2}$ and Cj+2 can be seen, as well as rows Li+1, Li, Li−1, Li−2. Above each diffused island (not visible), a contact which ensures a connection to a reference line Vss has been shown as a square in dotted lines and a contact to a bit line Cj through a via 24 has been shown as a square in continuous line.

FIG. 7C shows a perspective cross-sectional view according to line CC of FIG. 7B (along a row) of a structure according to the present invention at the end of the Front End steps.

As it can be seen in FIG. 7C, the activated columns are separated from one another by thick oxide columns 30 (first fabrication step). At regular intervals, rows of polysilicon Li, Li+1, extend, on the one hand above thick oxide regions 30 and on the other hand above thin oxide areas 31 formed on the active portions (second fabrication step). Then, the structure is submitted to an N-type implant to form islands 21 of the second conductivity type in the active columns between the gate regions (third fabrication step). After that, the structure of FIG. 7C is coated with an insulating layer (not shown) which is preferably planarized. At this stage, the structure can be stored to wait for the implementation of vias 22, pads 23 and vias 24 of FIG. 7A. The first metallization and via levels can also be implemented up to the level of metallization and vias which determines the programming of a memory according to the present invention The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A ROM memory array including a plurality of memory locations and having substantially orthogonal rows and columns comprising:

a semiconductor substrate of a first conductivity type;

thick oxide columns disposed along said semiconductor substrate for separating active columns defined between said thick oxide columns;

conductive gate rows disposed over said semiconductor substrate, thick oxide columns and active columns, and having a gate insulator being interposed between said gate rows and active columns where said gate rows cover the active columns;

islands of a second conductivity type formed in said semiconductor substrate and limited by the thick oxide columns and the gate rows;

first conductive columns positioned over and corresponding to each of said active columns, said first conductive columns constituting bit lines;

second conductive columns positioned parallel to, and separated by a distance which is approximately twice that of the first conductive columns, said second conductive columns constituting reference lines; and connection means for selectively coupling each island to either a first corresponding conductive column selected from said first conductive columns or a second corresponding conductive column selected from said second conductive columns for respectively activating or inactivating an associated memory location selected from said plurality of memory locations.

2. The ROM memory array according to claim 1, further comprising an active transistor comprised of two islands located on either side of a gate area, having the first island coupled to said first corresponding conductive column and the second island to said second corresponding conductive column.

3. The ROM memory array according to claim 1, further comprising an inactive transistor comprised of two islands located on either side of a gate area, having its two islands coupled to any one of said first corresponding conductive column and said second corresponding conductive column.

4. The ROM memory array according to claim 1, wherein each of the islands is connected to pads located at a first metallization level.

5. The ROM memory array according to claim 4, wherein some of the pads are connected to a second metallization level for enabling programming of the array.

6. The ROM memory array according to claim 1, wherein fewer islands are coupled to said first conductive columns than to said second conductive columns.

7. The ROM memory array of claim 1, wherein any said memory locations is activated when islands associated therewith are alternately coupled to said first and second columns.

8. The ROM memory array of claim 1, further comprising:

an active transistor comprised of two islands located on either side of a first gate area, having the first island coupled to said first corresponding conductive column and the second island to said second corresponding conductive column; and, an inactive transistor comprised of two islands located on either side of a second gate area, having its two islands coupled to any one of said first corresponding conductive column and said second corresponding conductive column.

9. A ROM memory array including a plurality of memory locations and having substantially orthogonal rows and columns comprising:

a semiconductor substrate of a first conductivity type;

thick oxide columns disposed along said semiconductor substrate for separating active columns defined between said thick oxide columns;

conductive gate rows disposed over said semiconductor substrate, thick oxide columns and active columns and having a gate insulator being interposed between said gate rows and active columns at the locations where said gate rows cover the active columns;

islands of a second conductivity type formed in said semiconductor substrate and limited by the thick oxide columns and the gate rows;

first conductive columns positioned over and corresponding to the active columns, said first conductive columns constituting bit lines;

second conductive columns positioned over said active columns and constituting reference lines; and connection means for selectively coupling at least one of said islands to either a first corresponding conductive column selected from said first conductive columns or a second corresponding conductive column selected from said second conductive columns for respectively activating or inactivating a select memory location selected from said plurality of memory locations and associated with said at least one island.

10. The ROM memory array of claim 9, wherein each of said memory locations is activated when islands respectively associated therewith are alternately coupled to said first and second corresponding conductive columns.

11. A ROM memory array comprising:

a plurality of parallel gate rows, each gate row of said plurality disposed on a semiconductor substrate;

a plurality of pairs of parallel bit columns being insulated from and substantially perpendicular to said plurality of gate rows, each pair of said plurality of pairs having a first bit column separated by a given distance from a second bit column, wherein the distance separating two pairs of parallel bit columns selected from said plurality of pairs of parallel bit columns is substantially less than said given distance; and, a plurality of parallel reference columns also being insulated from and substantially perpendicular to said plurality of gate rows and associated with at least one of said pairs of parallel bit columns selected from said plurality of pairs of parallel bit columns.

12. The ROM memory array of claim 11, wherein a given space is defined between said first and second bit columns of each of said plurality of pairs, and wherein each of said plurality of reference columns is associated with a respective given space.

13. The ROM memory array of claim 11, wherein each of a plurality of memory locations of said array is activated when associated islands are alternately coupled to a bit column of a pair selected from said plurality of pairs and a reference column selected from said plurality of reference columns.

14. A ROM memory array including a plurality of active and inactive memory locations and having substantially orthogonal rows and columns comprising:

a semiconductor substrate of a first conductivity type;

thick oxide columns disposed along said semiconductor substrate for separating active columns defined between said thick oxide columns;

conductive gate rows disposed over said semiconductor substrate, thick oxide columns and active columns, and having a gate insulator being interposed between said gate rows and active columns where said gate rows cover the active columns;

islands of a second conductivity type formed in said semiconductor substrate and limited by the thick oxide columns and the gate rows;

first conductive columns positioned over and corresponding to each of said active columns, said first conductive columns constituting bit lines; and, second conductive columns separated by a distance which is approximately twice that of the first conductive columns, said second conductive columns constituting reference lines;

wherein, each of said plurality of active and inactive memory locations is associated with a plurality of said islands; and, said plurality of islands respectively associated with any of said active memory locations are respectively coupled to different columns selected from said first conductive columns and said second conductive columns; and, said plurality of islands respectively associated with any of said inactive memory locations are respectively coupled any one of said first conductive columns and said second conductive columns.

* * * * *